US 9,438,001 B2

(12) United States Patent
Rozynski

(10) Patent No.: US 9,438,001 B2
(45) Date of Patent: Sep. 6, 2016

(54) LASER DEVICE AND METHOD FOR PRODUCING SAME

(75) Inventor: Andreas Rozynski, Regensburg (DE)

(73) Assignee: OSRAM GmbH, Munich (DE)

( * ) Notice: Subject to any disclaimer, the term of this patent is extended or adjusted under 35 U.S.C. 154(b) by 434 days.

(21) Appl. No.: 14/002,577

(22) PCT Filed: Feb. 29, 2012

(86) PCT No.: PCT/EP2012/053439
§ 371 (c)(1),
(2), (4) Date: Aug. 30, 2013

(87) PCT Pub. No.: WO2012/117019
PCT Pub. Date: Sep. 7, 2012

(65) Prior Publication Data
US 2013/0335711 A1  Dec. 19, 2013

(30) Foreign Application Priority Data

Mar. 3, 2011 (DE) .................. 10 2011 005 014

(51) Int. Cl.
| H01S 5/00 | (2006.01) |
| H01S 3/00 | (2006.01) |
| G02B 7/02 | (2006.01) |
| G02B 19/00 | (2006.01) |
| G03B 21/20 | (2006.01) |
| H01S 3/02 | (2006.01) |
| H01S 5/022 | (2006.01) |

(52) U.S. Cl.
CPC .............. *H01S 3/005* (2013.01); *G02B 7/023* (2013.01); *G02B 19/0014* (2013.01); *G02B 19/0052* (2013.01); *G03B 21/2013* (2013.01); *G03B 21/2033* (2013.01); *H01S 3/02* (2013.01); *H01S 5/02288* (2013.01); *H01S 5/005* (2013.01); *H01S 5/02212* (2013.01); *Y10T 29/49826* (2015.01)

(58) Field of Classification Search
CPC ... G02B 7/023; G02B 19/0052; H01S 3/005; H01S 3/02; H01S 5/02288; H01S 5/02212; H01S 5/005
See application file for complete search history.

(56) References Cited

U.S. PATENT DOCUMENTS 6,982,817 B1 * 1/2006 Halldorsson ............. G02B 5/32
359/22
2004/0075917 A1 * 4/2004 Sato ..................... G02B 6/4206
359/821

FOREIGN PATENT DOCUMENTS

| GB | 2 426 076 | 11/2006 |
| JP | 11 097800 | 4/1999 |
| JP | 2002 232064 | 8/2002 |
| JP | 2009 230031 | 10/2009 |
| JP | 2010 103323 | 5/2010 |

* cited by examiner

*Primary Examiner* — Armando Rodriguez
(74) *Attorney, Agent, or Firm* — Cozen O'Connor

(57) ABSTRACT

A method for producing a laser device having a laser configured in order to emit a laser beam, a lens (31) which is positionally adjusted with respect to the laser, and a lens holder having at least two parts (2a, b, c) then following one another in a propagation direction (3) of the laser beam, of which at least two lens holder parts (2a, b, c) each have an end side oriented obliquely with respect to the propagation direction (3) and can be brought into a multiplicity of relative positions with respect to one another, respectively, with their end sides oriented obliquely with respect to the propagation direction (3) bearing on one another, wherein the length of the lens holder (1) in the propagation direction (3) is adjusted by selecting one of the relative positions.

14 Claims, 5 Drawing Sheets

LASER DEVICE AND METHOD FOR PRODUCING SAME

RELATED APPLICATIONS

This is a U.S. national stage of International application No. PCT/EP2012/053439 filed on Feb. 29, 2012.

This application claims the priority of German application no. 10 2011 005 014.0 filed Mar. 3, 2011, the entire content of which is hereby incorporated by reference.

FIELD OF THE INVENTION

Technical Field

The present invention relates to method for producing a laser device having a laser configured in order to emit a laser beam, in particular a semiconductor laser, and a lens which is positionally adjusted with respect to the laser. Furthermore, the invention also relates to a laser device produced according to the invention and to its use.

BACKGROUND OF THE INVENTION

In the case of laser devices, or methods relating to their production, known from the prior art, a semiconductor laser is mounted in a metal housing and the laser beam is focused using a lens which bears internally on a through-opening of a housing cover and is held there by a clamping seat.

In relation to developments for the most recent high-precision laser devices, as a function of the deflection or focusing of the laser beam, a lens is adjusted relative to a lens holder with a semiconductor laser provided therein, and subsequently fixed on the lens holder with an adhesive bond. In this case, a distance between the lens holder and the lens, respectively differing as a function of the adjustment, is bridged by an adhesive film of respectively differing thickness.

SUMMARY OF THE INVENTION

One object of the present invention is to provide a particularly advantageous technique for producing a laser device having a lens positionally adjusted with respect to a laser.

This and other objects are attained in accordance with one aspect of the present invention that relates to a lens holder having at least two parts following one another in a propagation direction of the laser beam, of which at least two lens holder parts each have an end side oriented obliquely with respect to the propagation direction and can be brought into a multiplicity of relative positions with respect to one another, respectively with their end sides oriented obliquely with respect to the propagation direction bearing on one another, wherein the length of the lens holder in the propagation direction is adjusted by selecting a relative position.

The lens holder can be adjusted in terms of its length, for adaptation to distances between the lens and the laser, which differ as a function of the adjustment. To this end, the lens holder is (at the least) divided into two and the lens holder parts can be placed on one another in different relative positions, which leads to different lens holder lengths owing to the end sides, oriented obliquely with respect to the propagation direction, of the lens holder parts.

In one relative position, on the one hand, the distance between the lens holder parts (between their volume centroids) perpendicularly to the propagation direction is established and, on the other hand, the orientation of a lens holder part in relation to its volume centroid is also respectively established (apart from symmetry operations). Furthermore, the lens holder parts bear on one another with their oblique end sides in a relative position; this, however, is not meant to exclude the presence of an interlayer, for example an immersion material, i.e. the contact is not necessarily direct, even though this is preferred.

If, for example, the lens holder parts can merely be moved on one another with a movement component oriented perpendicularly to the propagation direction, a corresponding relative position is also reached simultaneously with the contact of the oblique end sides. The lens holder parts may also bear on one another with their oblique end sides and then be displaced on one another while remaining in contact, a multiplicity of relative positions being passed through (this will be referred to below as displacement along the oblique end sides).

Owing to the length adaptation, according to the invention, of the lens holder, advantageously on the one hand lens holders of different length do not need to be made available, which also helps to reduce the logistical outlay in manufacture; on the other hand, an adjustment-dependent distance is not bridged merely by adhesive, which reduces the risk of deadjustment of the lens by shrinkage of the adhesive during curing, and thus increases the precision.

The lens holder is in at least two parts, and thus, for example, a further lens holder part may also be provided following the two lens holder parts with oblique end sides in the propagation direction, for instance in order to bridge a distance present in any case independently of an adjustment variation. Furthermore, more than two lens holder parts with oblique end sides may also be cascaded; nevertheless, for the sake of clarity, two lens holder parts each with an oblique end side will be discussed below.

The lens holder parts following one another in the propagation direction, consisting for example of plastic or glass, are respectively referred to as a part even though such a part per se could be formed in a plurality of parts; preferably, however, the lens holder parts are each in one piece.

The propagation direction of the laser beam may also be given as an average value of a multiplicity of directions, for instance when the laser beam travels convergently or divergently. When reference is made to the propagation direction, this also does not necessarily presuppose beam propagation actually taking place, but describes a geometrical arrangement as if beam propagation were taking place.

During the position adjustment, for example for adaptation of a beam cross section along the propagation direction and/or for adaptation of a beam deflection perpendicular to the propagation direction, the lens may be displaced and in this case passed through by the laser beam. In general, the position adjustment may take place before, after or even together with the length adaptation of the lens holder, combinations also being possible, for instance when the lens is readjusted.

The oblique end sides of the two lens holder parts are preferably mutually complementary, and in any event to at least 50%, 60%, 70%, 80%, 90% of the surface of a smaller-area one of the oblique end sides, increasingly preferably in this order; all indications given below for an oblique end side therefore preferably refer to the respectively oblique end side of the two lens holder parts.

The end side, oriented obliquely with respect to the propagation direction, of a lens holder part is not necessarily planar, but may for example also be formed in a stepped fashion, the length adaptation then being carried out in stages in the case of complementary end sides. Thus, if a non-planar end face is provided, the term "transverse with respect to the propagation direction" refers to the profile of the end side as a linear average, considered in a section plane containing the propagation direction (and in section planes parallel thereto).

In what follows, and throughout the disclosure, distinction will not be made in detail between the description of the method for producing the laser device, the device aspect and the use of the device; the disclosure is implicitly to be interpreted with respect to all categories.

Above all in combination with a particularly exactly positioned lens, for a lens holder correspondingly finely adjustable in terms of its length, an angle of at least 60° as the smallest angle formed between the oblique end side and the propagation direction, increasingly preferably in this order at least 65°, 70°, 75°, 80°, 85°, and independently thereof at most 89.5°, increasingly preferably in this order at most 89°, 88.5°, 88°, 87.5°, have proven advantageous. In this way, "translation" can be achieved between a distance lying perpendicularly to the propagation direction between two relative positions and a difference between the corresponding lens holder lengths, so that for example particularly accurate length adaptation is possible.

In another configuration, the relative positionability of the lens holder parts is blocked by a joint connection connecting the lens holder parts. This joint connection positionally fixes the lens holder parts relative to one another permanently by flowable, i.e. liquid with a certain viscosity, material between or preferably on (but not between) the lens holder parts, which solidifies for the purpose of the joint connection; the material is thus converted into a solidified state, for instance by contact with air or another gas, or by addition of a chemical reaction partner or by another interaction, for example with light.

The solidified material is then fixed in shape, in the sense of at least essentially maintaining its shape, i.e. it may possibly still react elastically or viscoplastically to a mechanical stress, and is not necessarily rigid in shape. The joint connection is permanent merely in the sense that it could also be separated again, for instance by mechanical action, heating or chemical treatment.

It is preferable to provide, as flowable material, an adhesive which, besides plastic material, may also contain additives, for instance glass to minimize shrinkage during curing. More preferred is the use of a UV-curing adhesive which is precured and/or fully cured by exposure to UV light.

In another configuration, a guide device used for mounting is provided for the lens holder parts, which are then blocked in their relative positionability by the joint connection, and the lens holder parts are connected to one another during the length adaptation only by this guide device; the guide device is removed after the joint connection has been produced. The lens holder parts may, for example, be held on guide tools of the guide device by a clamp or screw mechanism; a vacuum mechanism is preferred.

With such a guide device, the lens holder parts can be positioned relative to one another, and more preferably the lens and the laser can also be positionally adjusted in the same guide device. The lens, the laser and the lens holder parts are in this case initially movable relative to one another, a state optimized in terms of laser deflection and/or laser focusing then being "frozen in" by joint connections, for instance by joint connections between lens and lens holder part, lens holder part and lens holder part, and/or lens holder part and laser.

In a preferred configuration, the lens holder part fastened on a housing of the laser by a joint connection, and preferably the entire lens holder, are particularly preferably positionally fixed relative to the laser exclusively by this joint connection, i.e. for example the lens holder is not additionally fixed on a printed circuit board making contact with the laser, so that for instance a deformation of the housing caused by different thermal expansion coefficients, and therefore a deformation of the printed circuit board, does not necessarily lead to deadjustment of the laser.

Another embodiment relates to a tubular lens holder part having a through-opening adapted to a housing of the laser, neither an outer shape nor the through-opening necessarily being formed circularly as seen in the propagation direction.

Before the position adjustment of the lens, the tubular laser housing is pushed into the through-opening of the lens holder part and is preferably also already positionally fixed relative to this lens holder part, for instance by a clamp connection and/or a joint connection.

In general, that is to say independently of the tubular configuration of a lens holder part, in a preferred configuration a first lens holder part is fixed in its position relative to the laser and the other lens holder part is then positioned relative to the first lens holder part and relative to the laser for the length adaptation. If the lens is in this case not yet fixed on the other lens holder part, it can still be adjusted along the propagation direction and transversely thereto. An adjustment-dependent distance between the lens and the first lens holder part (assigned to the laser) can then be compensated for by displacement of the second lens holder part (assigned to the lens) transversely to the propagation direction.

In the lens holder parts, through-openings for the laser beam are preferably provided, which more preferably may be brought to be congruent over a certain range of the relative positionability.

A preferred embodiment relates to a second lens holder part, assigned to the lens, on the end side of which opposite the oblique end side a bearing for the lens is provided, preferably a planar bearing; this lens is then fixed on the lens holder part by a joint connection after position adjustment perpendicularly to the propagation direction.

In the region of such a planar bearing between the lens holder and the lens, the lens may advantageously be fastened, without tilting its optical axis, on the lens holder. This permits exact positioning of the lens in, in principle, two different but also combinable ways: the lens may on the one hand already be positionally adjusted perpendicularly to the propagation direction, in which case the second lens holder part is then pushed in along the planar bearing or along the oblique end sides as far as the planar bearing; on the other hand, initially the lens may also be adjusted only in the propagation direction, the lens holder adapted in terms of length and the lens then adjusted along the planar bearing perpendicularly to the propagation direction.

Adjustment along the propagation direction, carried out in the case mentioned first after the adjustment perpendicularly to the propagation direction, may also be carried out with a lens already fastened on the second lens holder part, for instance in order to compensate for an offset occurring during the fastening.

Preferably, in the assembled lens holder, the lens holder parts bear directly on one another with their oblique end sides, i.e. the end sides touch. Then, for example, neither an adhesive film nor an immersion liquid is provided between the lens holder parts, although in general this would still be possible; this is because the selection of a relative position determines the length of the lens holder even when an interlayer is provided between the lens holder parts.

Nevertheless, the lens holder parts, preferably bearing directly on one another, are particularly preferably blocked in their relative positionability by a joint connection arranged on the outside perpendicularly to the propagation direction, so that the lens holder length can be substantially decoupled from shrinkage of the adhesive during curing.

In general, lens holder parts bearing on one another without relief cuts are preferred, and a line oriented parallel to the propagation direction thus respectively intersects the oblique end sides at most once. The lens holder parts are therefore not held together by a form fit, i.e. for example a screw thread, provided merely between the lens holder parts.

According to another preferred embodiment, the end side of a lens holder part is formed in a planar fashion. In this way, on the one hand, the geometry of the lens holder parts can be simplified, which for example can also offer cost advantages in the case of a mass-produced article; on the other hand, with oblique end sides formed in a planar fashion, continuous and therefore particularly flexible or accurate length adaptation is possible.

Preferably, the end side, opposite the oblique end side, of a lens holder part is oriented perpendicularly to the propagation direction, so that length adaptation of the lens holder can be carried out without tilting the optical axis of the lens.

Another aspect of the invention relates to a laser device having a laser, a lens which is positionally adjusted with respect thereto, and a lens holder consisting of at least two parts following one another in a propagation direction, at least two of which each have an end side oriented obliquely with respect to the propagation direction and bear on one another, preferably directly, with their obliquely oriented end sides.

Furthermore, an aspect of the invention relates to a laser RGB module having a corresponding laser device, and to its use as part of a projection device, in particular a portable projection device.

BRIEF DESCRIPTION OF THE DRAWINGS

The invention will be explained in more detail below with the aid of exemplary embodiments. In the figures.

DETAILED DESCRIPTION OF THE DRAWINGS

Figure 1:
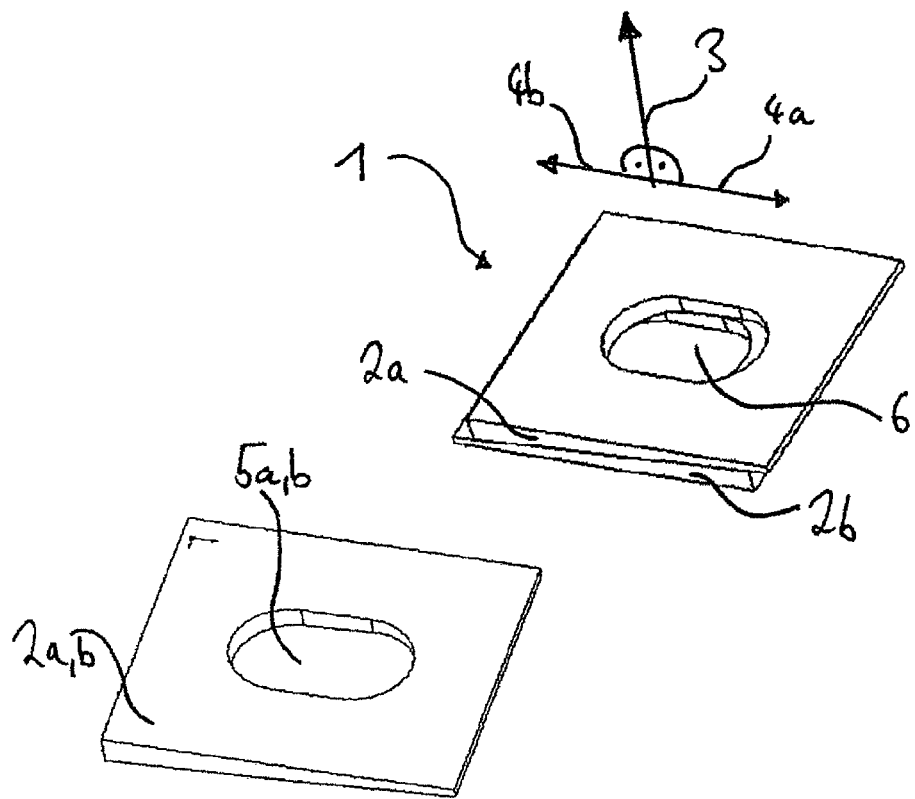
FIG. 1 shows a lens holder composed of two wedge-like lens holder parts.
Figure 1:
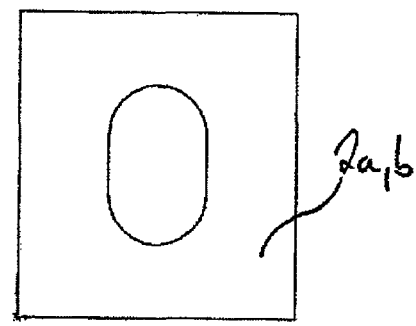

FIG. 1 shows a lens holder 1 according to the invention, which is composed of two wedge-like lens holder parts 2a, b, in the present case also of the same design, bearing directly on one another with oblique end sides. The length of the lens holder 1 in the through-direction 3 can be lengthened by relative displacement of the lens holder part 2a with respect to the lens holder part 2b in a direction 4a perpendicular to the propagation direction 3, and shortened by displacement in the opposite direction 4b.

Besides the lens holder 1, FIG. 1 furthermore shows an individual lens holder part 2a, b in an oblique view (left middle) and in plan view looking in the propagation direction 3 (bottom right). In the lens holder part 2a, b, an oval through-opening 5a, b extending through the lens holder part 2a, b in the propagation direction 3 is provided, which in the assembled lens holder 1 overlaps with a likewise oval through-opening of the second lens holder part 2a, b, so that the assembled lens holder 1 has a through-opening 6 for the laser beam.

The respectively oval through-openings 5a, b in the two lens holder parts 2a, b make it possible for a through-opening 6 for the laser beam to remain overall when there is mutual displacement of the two lens holder parts 2a, b in the two directions 4a, b perpendicular to the propagation direction 3.

Figure 2:
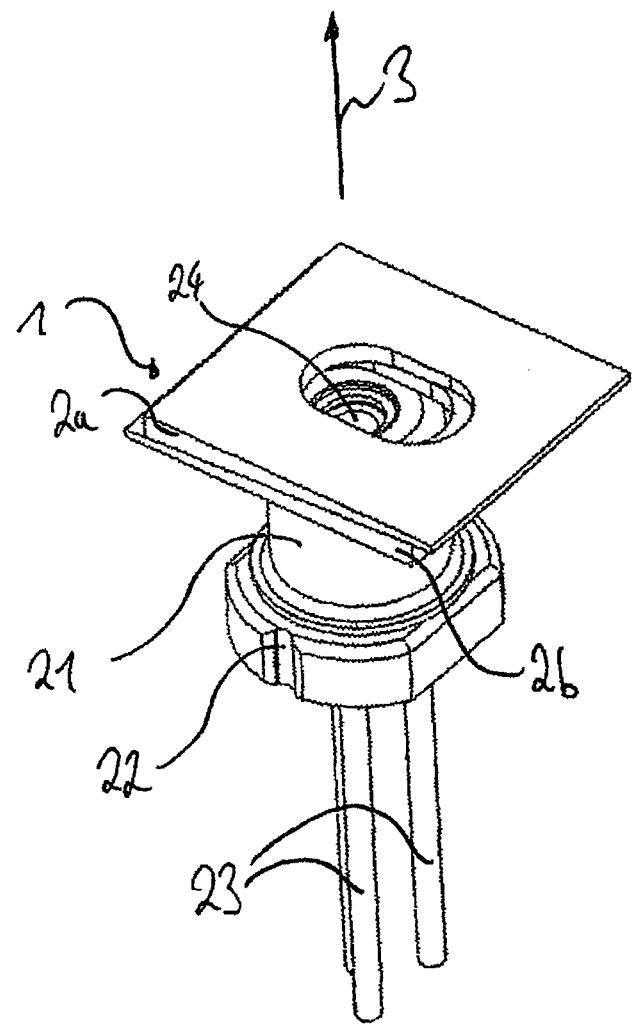
FIG. 2 shows a lens holder according to FIG. 1, which is placed on a housing of a laser.

FIG. 2 shows a lens holder 1 placed on a housing 21 having a heat sink 22 and contact pins 23 for the electrical contacting of a semiconductor laser (hereafter "laser"). Looking through the through-opening 6 in the lens holder 1, a window 24 in the housing 21 can be seen as an exit opening for the laser beam then propagating in the propagation direction 3.

The contact pins 23 are soldered into a printed circuit board, the lens holder 1 and the lens (not shown here), which is then positionally adjusted, advantageously not being connected directly to the printed circuit board. In this way, for example, it is possible to reduce displacements between the lens and the laser due to different thermal expansion coefficients of the printed circuit board, housing and lens holder.

Figure 3:
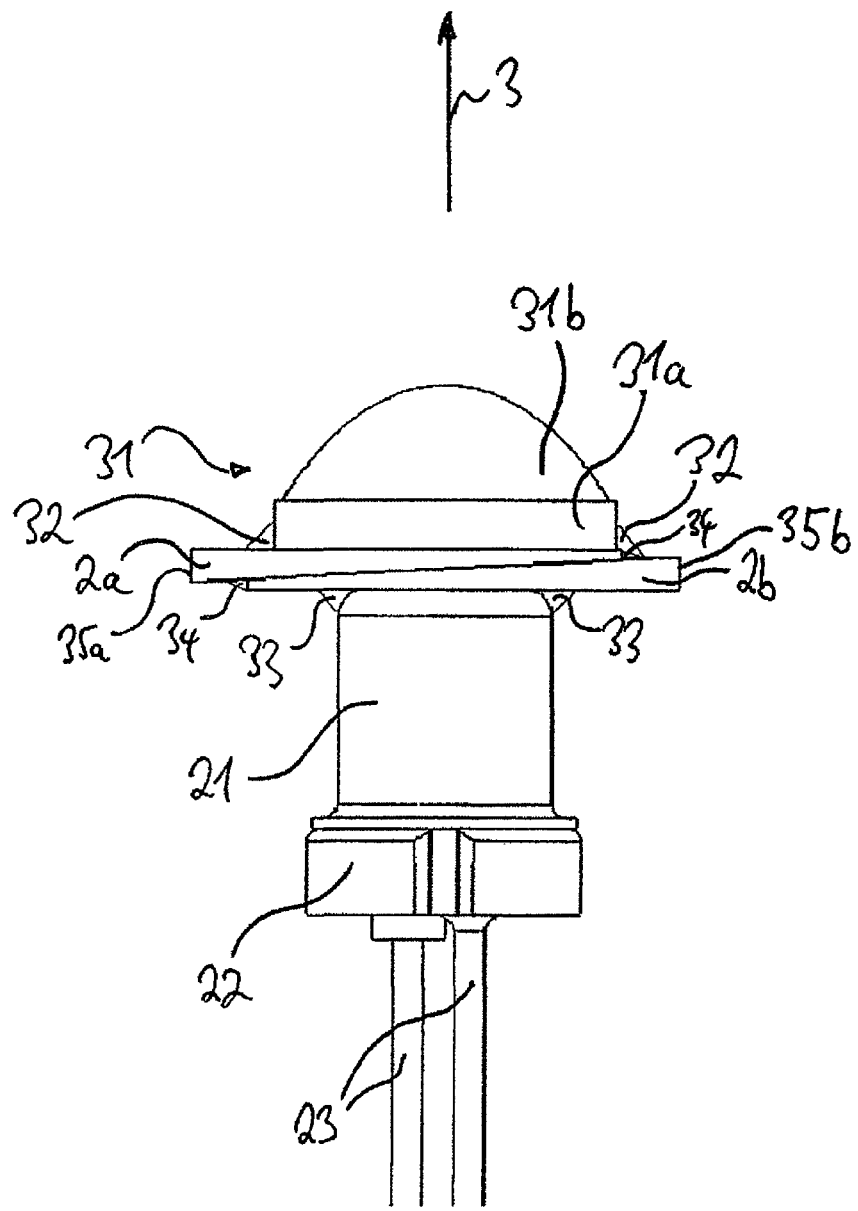
FIG. 3 shows a laser device having a laser in a housing, a lens holder, and a lens positionally adjusted with respect to the laser.

FIG. 3 shows a side view of the arrangement, explained with respect to FIG. 2, having a housing 21 and a lens holder 1, the lens 31 positionally adjusted with respect to the laser being represented here as well. The lens 31 is planoconvex with a cylindrical section 31a bearing on the lens holder 2a in a planar fashion, and a convex section 31b, shaped approximately as a segment of a sphere, following on therefrom. The lens 31, which is thus subdivided into two geometrical shapes but is integral, is fastened on the lens holder part 2a by a bond consisting of UV-curing adhesive 32.

In this exemplary embodiment, two adhesive spots 32 are provided opposite one another in order to minimize a shrinkage-induced offset of the lens 31; equally, a circumferential adhesive bond or a plurality of adhesive spots, respectively lying opposite one another, could be provided.

This likewise applies for the adhesive bond 33 between the housing 21 and the lens holder 2b. The relative positionability of the lens holder parts 2a, b is blocked by the adhesive bonds 34.

A laser device according to FIG. 3 is produced in the following way:

The housing 21 containing the laser is clamped by a clamping seat in a guide device via the heat sink 22 (this is a part of the housing) already firmly connected thereto in the course of housing the laser; the contact pins 23 are in this case also electrically contacted.

The lens 31 is held by a vacuum tool on its cylindrical section 31a and can be moved with this tool in the three spatial directions. The lens holder parts 2a, b are also each held under reduced pressure by a suitable guide tool, specifically on the respectively largest outer side 35a, b. In this case, the lens holder parts 2a, b are initially not yet in the position shown in FIG. 3, but lie outside it perpendicularly to the propagation direction.

Initially, the optical axis of the lens 31 is then aligned parallel with the propagation direction 3 of the laser beam, which is now already emitted for adjustment purposes; using a CCD camera arranged in the propagation direction 3, the diameter and deflection of the laser beam are measured.

In a next step, the beam diameter, i.e. the focusing of the laser beam, is optimized to the desired value by displacing the lens 31 along the propagation direction 3; subsequently, by displacing the lens 31 perpendicularly to the propagation direction 3, optimization of the laser beam deflection is carried out. Once the desired values have been reached, there is a gap of adjustment-dependent width between the planar side face, facing toward the laser, of the lens 31 and the housing 21.

The lens holder parts 2a, b are subsequently introduced into this gap from opposite directions. In this case, the lens holder part 2a is pushed in from the left along a planar bearing on the lens 31; the lens holder part 2b is pushed in from the right while bearing in a planar fashion on an end side of the housing 21. The lens holder parts 2a, b are pushed in until their end sides oriented obliquely with respect to the propagation direction 3 bear directly on one another. Contact between the lens holder parts 2a, b may, for example, be optically established by means of a minimal displacement of the lens 31 in the propagation direction 3, in which case such a movement may also already be taken into account as an offset in the prior adjustment.

After the lens holder parts 2a, b pushed in from opposite directions have come into contact with their oblique end sides, adhesive spots are dispensed and cured by exposure to UV light in order to produce the joint connections 33, 34 on the lens holder parts 2a, b and on the lens holder part 1 and housing 21.

As a function of the desired adjustment accuracy, the lens 31 may now still be displaced perpendicularly to the propagation direction 3, i.e. readjustment of the laser beam deflection may optionally be carried out. After the latter, or the like, simultaneously with adhesive bonds 33, 34, adhesive spots 32 are dispensed and cured by exposure to UV light in order to fasten the lens 31 on the lens holder 2a.

Figure 4:
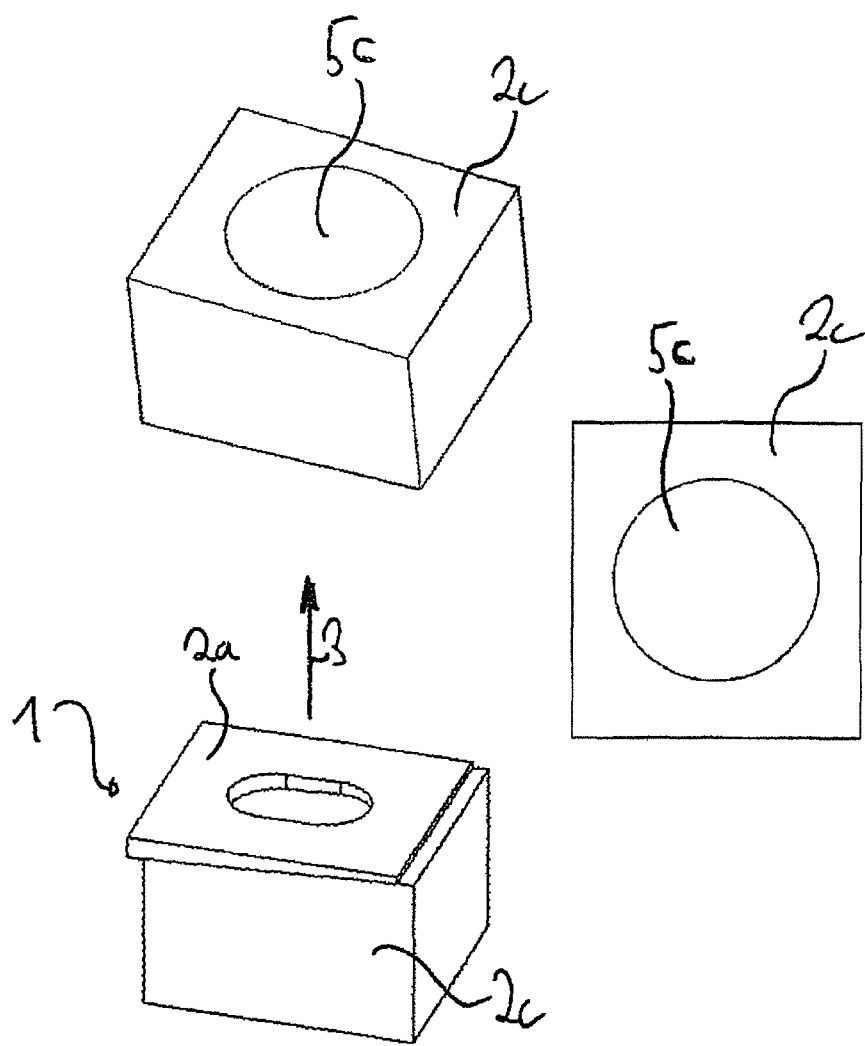
FIG. 4 shows a lens holder composed of a tubular lens holder part and a wedge-shaped lens holder part.

FIG. 4 shows a lens holder 1 consisting of a wedge-shaped lens holder part 2a, as explained with the aid of FIG. 1, and a lens holder part 2c formed as a tubular body. The lens holder parts 2a, c again bear directly on one another with end sides oriented obliquely with respect to the propagation direction 3, so that relative displacement along the oblique end sides causes a length change of the lens holder 1 in the through-direction 3. In FIG. 4, the lens holder part 2c is represented at the top left in an oblique view and at the middle right in plan view. A wedge-shaped through-opening 5c extending through the lens holder part 2c in the propagation direction can be seen in this case.

Figure 5:
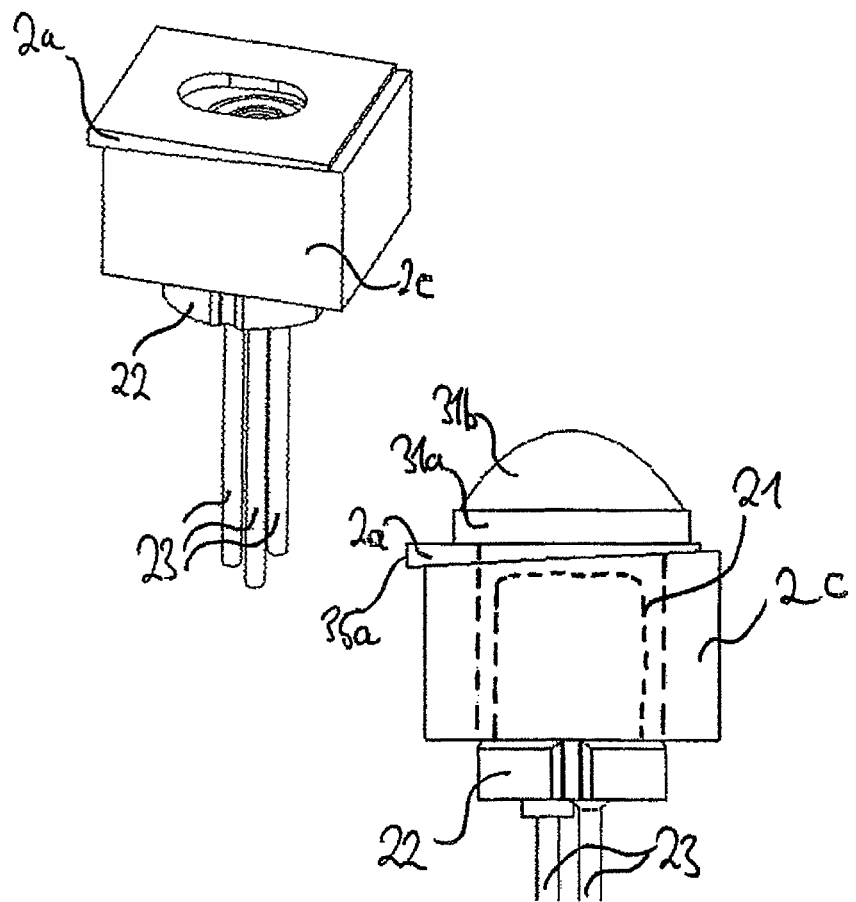
FIG. 5 shows a laser device having a laser in a housing, which is pushed into a tubular lens holder part according to FIG. 4, and a lens positionally adjusted with respect to the laser.

FIG. 5 represents a laser housed, in a similar way to FIGS. 2 and 3, in a housing 21 having a heat sink 22 and contact pins 23. The lens holder part 2b is pushed onto the housing 21 as far as a bearing on the heat sink 22, and held thereon by a clamping seat.

The mounting of the laser device shown at the bottom right in FIG. 5 is carried out in the following way:

The housing 21 is clamped with the base 22 and contact pins 23 into a guide device in the manner explained with respect to FIG. 3. The lens holder part 2c, held on a vacuum tool of the guide device, is subsequently pushed onto the housing 21 as far as a bearing on the heat sink 22, and is then already held by a press seat.

The position adjustment of the lens 31 is carried out in the way explained with respect to FIG. 3.

Subsequently, the lens holder part 2a held on the outer side 35a by a vacuum tool is pushed from the left into the gap between the lens 31 and the lens holder part 2c, specifically while bearing on a planar outer face of the lens 31a facing toward the laser.

Optionally after readjustment of the lens 31 perpendicularly to the propagation direction 3, adhesive spots are dispensed between the lens 31 and the lens holder part 2a and between the latter and the lens holder part 2c (not shown here) and are cured with UV light.

The lens holder parts 2a, c consist of a UV-transmissive plastic, so that the adhesive spots may also be cured by exposure from just one direction.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A method for producing a laser device having a laser configured in order to emit a laser beam, comprising:
   providing a lens;
   providing a lens holder having at least two parts arranged one after another in a propagation direction of the laser beam, wherein one of said at least two lens holder parts is a tubular body having a through-opening such that said one lens holder part can be pushed onto a housing of the laser, and pushing said one lens holder part onto the housing;
   wherein said at least two lens holder parts each have an end side oriented obliquely with respect to the propagation direction, bringing said parts into any of a multiplicity of relative positions with respect to one another, respectively, with their end sides oriented obliquely with respect to the propagation direction bearing on one another;
   adjusting the length of the lens holder in the propagation direction by selecting one of the relative positions of said parts;
   attaching said lens to said lens holder; and
   blocking further positioning of the lens holder parts relative to each other.

2. The method as claimed in claim 1, wherein the smallest angle formed between the oblique end side of a lens holder part and the propagation direction is at least 60° and at most 89.5°.

3. The method as claimed in claim 1, wherein the relative positionability of the lens holder parts is blocked by a joint connection connecting the lens holder parts.

4. The method as claimed in claim 3 with a guide device used for mounting, wherein the lens holder parts are connected to one another during the length adaptation only by the guide device and the latter is removed after the joint connection has been produced.

5. The method as claimed in claim 1, wherein one of the lens holder parts is fixed on a housing of the laser by a joint connection.

6. The method as claimed in claim 1, wherein one of said at least two lens holder parts is fixed in its position relative to the laser and another of said at least two lens holder parts is positioned relative to the one lens holder part and relative to the laser for the length adaptation.

7. The method as claimed in claim 1, wherein a bearing for the lens is provided on an end side of a lens holder part opposite the oblique end side, and the lens is fixed on the bearing by a joint connection after position adjustment perpendicularly to the propagation direction.

8. The method as claimed in claim 7, wherein the lens together with the lens holder part is subsequently positionally adjusted along the propagation direction and the relative positionability of the lens holder parts is then blocked by a joint connection connecting the lens holder parts.

9. The method as claimed in claim 1, wherein the lens holder parts bear directly on one another with their end sides oriented obliquely with respect to the propagation direction.

10. The method as claimed in claim 1, wherein the end side, oriented obliquely with respect to the propagation direction, of a lens holder part is formed in a planar fashion.

11. A laser device comprising:
a laser configured in order to emit a laser beam;
a lens;
a lens holder having at least two parts arranged one after another in a propagation direction, wherein said at least two lens holder parts each have an end side oriented obliquely with respect to the propagation direction and these lens holder parts bear on one another with their end sides oriented obliquely with respect to the propagation direction, and
wherein one of the lens holder parts is a tubular body having a through-opening such that said one lens holder part can be pushed onto a housing of the laser, and said one lens holder part is pushed onto the housing before the position adjustment of the lens.

12. A laser RGB module having a laser device as claimed in claim 11.

13. A projection device comprising the laser device as claimed in claim 11.

14. A projection device comprising the laser RGB module as claimed in claim 12.

* * * * *